United States Patent
Maleville et al.

(10) Patent No.: US 7,022,586 B2
(45) Date of Patent: Apr. 4, 2006

(54) METHOD FOR RECYCLING A SUBSTRATE

(75) Inventors: Christophe Maleville, La Terasse (FR); Fabrice Letertre, Grenoble (FR); Thibaut Maurice, Grenoble (FR); Carlos Mazure, St. Nazire les Eymes (FR); Frederic Metral, St. Quantin sur Isère (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 84 days.

(21) Appl. No.: 10/728,343

(22) Filed: Dec. 3, 2003

(65) Prior Publication Data

US 2004/0112866 A1 Jun. 17, 2004

Related U.S. Application Data

(60) Provisional application No. 60/472,469, filed on May 22, 2003, provisional application No. 60/467,242, filed on Apr. 30, 2003.

(30) Foreign Application Priority Data

Dec. 6, 2002 (EP) ................... 02293043
Dec. 6, 2002 (EP) ................... 02293044

(51) Int. Cl.
*H01L 21/30* (2006.01)
(52) U.S. Cl. .................................... 438/458
(58) Field of Classification Search ............... 438/4, 438/455, 458; 216/2
See application file for complete search history.

(56) References Cited

U.S. PATENT DOCUMENTS

| 5,152,168 | A | * | 10/1992 | Barlocchi et al. ............. 73/104 |
| 5,710,057 | A | * | 1/1998 | Kenney ...................... 438/406 |
| 5,994,207 | A | | 11/1999 | Henley et al. .............. 438/515 |
| 6,221,774 | B1 | * | 4/2001 | Malik ......................... 438/690 |
| 6,265,314 | B1 | | 7/2001 | Black et al. ................ 438/690 |

(Continued)

FOREIGN PATENT DOCUMENTS

| EP | 0 955 671 A1 | 11/1999 |
| EP | 1 156 531 A1 | 11/2001 |
| EP | 1 170 801 A1 | 1/2002 |
| FR | 2 794 891 | 12/2000 |

(Continued)

OTHER PUBLICATIONS

Machine Translation of JP 11-297583 first cited by applicant in IDS of Apr. 16, 2004, 25 pages.*

(Continued)

*Primary Examiner*—Evan Pert
(74) *Attorney, Agent, or Firm*—Winston & Strawn LLP

(57) ABSTRACT

The present invention relates to a method for recycling a substrate that has a residue on its surface and a detachment profile resulting from an implantation process. The method includes removing the residue from the substrate to a level substantially equivalent to that of the detachment profile, thus obtaining a substantially uniform planar surface on the substrate, and then polishing the entire surface of the substrate to eliminate defects.

29 Claims, 3 Drawing Sheets

U.S. PATENT DOCUMENTS

| | | | |
|---|---|---|---|
| 6,284,628 B1 | 9/2001 | Kuwahara et al. | 438/459 |
| 6,312,797 B1 * | 11/2001 | Yokokawa et al. | 428/336 |
| 6,426,270 B1 | 7/2002 | Sakaguchi et al. | 438/406 |
| 6,596,610 B1 | 7/2003 | Kuwahara et al. | 438/458 |
| 6,720,640 B1 * | 4/2004 | Kuwabara et al. | 257/618 |
| 6,815,309 B1 * | 11/2004 | Letertre et al. | 438/406 |
| 6,846,718 B1 * | 1/2005 | Aga et al. | 438/406 |
| 2001/0055854 A1 | 12/2001 | Nishida et al. | 438/455 |

FOREIGN PATENT DOCUMENTS

| | | |
|---|---|---|
| JP | 11297583 | 1/1980 |
| WO | WO 98/52216 | 11/1998 |
| WO | WO 01/41218 A1 * | 6/2001 |
| WO | WO 01/80308 A2 | 10/2001 |

OTHER PUBLICATIONS

XP000326239, "Surface Profilometer With Ultra-High Resolution" IBM Technical Disclosure Bulletin, IBM Corp, vol. 35. No. 3 , pp. 207-208 (1992).

M. Bruel, Auberton-Herve et al., "Industrial Status of SOI Wafer Production and New Material Developments", Smart Technology, ECS Spring Meeting 99, Electronics Division, 9th Int'l Symposium on Silicon on Insulator Technology.

K. Mitani, "Technical Challenges in High Volume Unibond SOI Wafer Manufacturing", Semicon West 98, SOI Seminar (1998).

* cited by examiner

METHOD FOR RECYCLING A SUBSTRATE

This application claims the benefit of U.S. provisional applications 60/467,242 filed Apr. 30, 2003 and 60/472,469 filed May 22, 2003, the entire content of each of which is expressly incorporated herein by reference thereto.

BACKGROUND

The present invention relates to a method for recycling a substrate, especially a wafer, that has a residue on its surface and a detachment profile resulting from an implantation process. The method includes removing the residue from the substrate to a level substantially equivalent to that of the detachment profile, thus obtaining a substantially uniform planar surface on the substrate, and then polishing the entire surface of the substrate to eliminate defects.

Recycling or reprocessing of substrates, especially semiconductor wafers in semiconductor technology, offers the opportunity to save a lot of money in new material costs. A wafer recycling process involves essentially three main steps: removing unwanted materials, polishing, and cleaning.

Wafer recycling plays a particularly important role in the SMART-CUT® process, shown schematically in FIGS. 1a to 1f. In this example, a first silicon wafer 1 is oxidized to form an oxidized layer 3 and then implanted with gaseous species like hydrogen ions or gas ions 4 (FIG. 1c). The implantation creates a buried, weakened layer comprising microcavities, platelets and/or microbubbles. The implanted wafer is bonded to a second silicon wafer 2 (FIG. 1d) and then detached by splitting at a depth corresponding to the penetration depth 5 of the implanted species (FIG. 1e). The result is the production of a SOI (silicon on insulator) wafer that includes the original second wafer 2 and a SOI layer 7, and a remaining delaminated wafer 1', which is a smaller portion of the first silicon wafer 1.

The delaminated wafer 1' cannot be reused directly because it includes a damaged and rough surface 8 which is surrounded by a collar 9 in the form of a step located about the peripheral part of the wafer 1'. The collar 9 is formed during bonding in the SMART-CUT® process wherein the surfaces of both wafers 1 and 2 are bonded except for an edge portion where the wafers are not flat. In particular, when the first wafer is detached from the second wafer, part of the surface of the first wafer 1 which is bonded with the second wafer 2 is transferred onto the second wafer 2. The excluded edge portion which is not bonded is not transferred, and it forms the collar 9 of the delaminated wafer 1'. A loss of material also results at the edge of the positive wafer containing the original wafer 2 and a SOI-layer 7 split from the first wafer 1.

In order to reuse the detached, delaminated wafer 1', the non-uniform detachment profile shown in FIG. If must be made planar. A chemical and/or mechanical polishing (CMP) is conventionally used to remove the residual material from the uneven topography on the wafer surface to obtain a uniform planarization globally across the wafer. A load force is applied to the entire surface 8 including its collar 9 of the wafer 1' while it rests on a pad (not shown). The pad and the wafer are then counter-rotated while a slurry containing abrasives and reactive chemicals is passed underneath. This recycling method requires too much material to be removed from the wafer and has a long processing time which is necessary to get a reasonably acceptable value of the total thickness variation (TTV) of the recycled delaminated wafer. This limits the amount of recoverability of the wafer. Furthermore, there is a risk that the wafer may break during planarization, especially when the wafer is repeatedly recycled.

U.S. Pat. No. 6,284,628 describes a method for recycling a delaminated wafer of the above mentioned type in which the delaminated wafer surface is polished to remove about 1 μm material from the surface and is then heat-treated in a reducing atmosphere at a temperature between 1000° C. and the melting point of the wafer material for several hours. Such thermal treatment places a strong load on the treated wafer and requires a lot of energy and processing time.

It would be advantageous if a method were available that does not include thermal treatment, which allows a substrate to be reused more often, and that produces recycled substrate with a low total thickness variance such that a good planar surface quality may be obtained.

SUMMARY OF THE INVENTION

The present invention relates to a method for recycling a substrate. The substrate has a detachment profile that includes a residue or residual topography resulting from an ion implantation process. The method includes the steps removing the residue from the substrate to a level substantially equivalent to that of the detachment profile to obtain a substantiafly uniform planar surface on the substrate; and polishing the entire surface of the substrate to eliminate defects and to prepare the surface in condition for molecular bonding to another substrate.

The residue can be removed in any one of a variety of ways. The residue can be removed using local polishing. In this situation, the polishing applies mechanical pressure at an angle relative to the surface of the substrate for best results. Also, the method further comprises controlling removal of the residue with a mechanical profilometer to accurately obtain the final surface.

The residue can also be removed using a chemical attack. Before doing so, it is useful to cover a region on the surface with a protective layer before removing the residue. This protective layer can be formed by photolithography. Generally, the protective layer is an etch resistant material and is applied prior to the chemical removal of the residue.

The residue can also be removed using a local ion attack. The residue can be bombarded with at least one of ions and ion clusters to sever the residue. For example, an ion beam can be directed approximately perpendicular to the surface of the substrate to remove the residue. An Argon ion beam is suitable for this purpose. A laser beam can also be used to sever the residue. This is generally focused on at least the interface, such as by being aligned parallel to the surface of the substrate. If desired, the laser beam can be focussed onto the residue using a screen having a slit.

The residue can also be removed by mechanical means. For example, the residue can be severed by directing at least one of a jet stream of water, a jet stream of air, and a jet stream of fluid at it. When this is done, the jet stream preferably is directed against the residue at an acute angle to the surface, so that the jet stream impinges at least on the interface.

Another way to remove the residue is to apply a shock wave on a back side of the substrate to sever the residue. It is helpful to rotate the substrate to assist in removing or severing the residue. The residue can be removed or severed in a piecewise manner, if desired.

The residue is severed from the substrate in order to preferably obtain a substantially uniform planar surface on the substrate. If necessary, the entire surface of the substrate can be planarized after removal of the residue so that the surface is in a condition for bonding to another semiconductor substrate. Generally, the surface is thinned by about 0.1 to 0.3 μm, and preferably 0.2 μm during planarizing, as this represents the amount corresponding to the approximate depth of the damage resulting from an implantation process. Also, the substrate is generally planarized without a heat treatment.

The present invention thus provides an improved method of recycling a wafer which allows a recycled wafer to be reused more often and enables the recycled wafer to be produced with a low total thickness variance wherein a good planar surface quality is obtained.

BRIEF DESCRIPTION OF THE DRAWINGS

Embodiments of the present invention are described in the following description with reference to the accompanying figures, in which.

DETAILED DESCRIPTION OF THE PREFERRED EMBODIMENTS

Figure 1A:
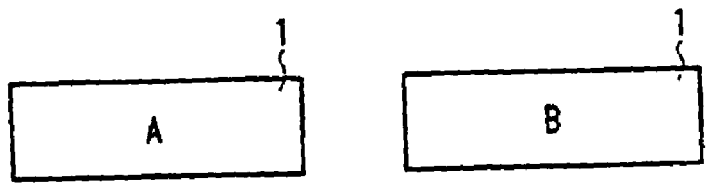
FIGS. 1a to 1f show a conventional SMART-CUT® process.
Figure 1B:
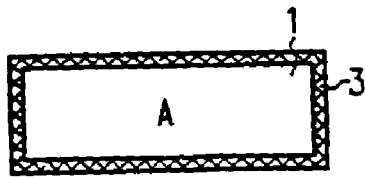

The present technique selectively removes a collar or residue from a wafer to obtain a planar surface. The residue can be severed piece-by-piece using a localized process, which results in a smooth surface over the entire substrate. Since only residual material is removed, a very small loss of material occurs. Therefore, the substrate can be reused and recycled more often than when using conventional recycling techniques. Another advantage is that a very low total thickness variation of the recycled substrate occurs when the present method is used. Due to the reduction in the material removed, the recycled substrate can be used over more recycling steps and is therefore more stable. Consequently, the method reduces the risk of breaking the substrate. In addition, the methods used to sever the collar result in shortening the treatment process of the substrate which enhances the productivity of recycling.

The method is particularly advantageous for recycling substrates in which the interface material has been pre-weakened by an implantation step. The pre-weakened material of such substrates acts as a predetermined breaking point at which the collar is removed.

In an embodiment, a jet of water and/or air and/or fluid effectively removes the collar or residue by rinsing and/or spraying it away. Advantageously, the jet is aimed in such a manner so that residue pieces do not affect the surface of the substrate when removed. The energy of the jet may be concentrated on the interface to remove the residue instantly.

In another embodiment, a laser beam may be used to remove the collar. The laser beam may at least impinge on the interface between the surface and the collar, which can be used as a break point. Removal in this manner provides an exceptionally smooth planar surface. The laser beam can also be aligned parallel to the surface of the wafer and directly at the interface to efficiently remove the material.

A shock wave could also be applied to the backside of a substrate. This shock wave induces frictional forces between the edges of the collar especially at the interface.

In another implementation, the method involves planarizing only the residue or region of the surface that is close to the edge of the substrate by a successive thinning of the reside material. The technique achieves a smooth surface, and may be precisely controlled so that the continuous attack from above or from the side and the removal of a surface inhomogeneity or residue at the region close to the edge removes only the necessary amount of material. Because the removal of material is restricted, only a small amount of material is removed, and the resulting recycled substrate is thicker and therefore more stable, with reduced risk of breaking during recycling process. Hence, the method allows the substrate to be reused and recycled more often. Moreover, a low total thickness variation of the recycled substrate is achieved.

In a further embodiment of the invention, a mechanical pressure is applied on the edge of the substrate, wherein the pressure is directed at an angle relative to the surface of the substrate. The mechanical pressure advances the material removal from the surface at the edge of the substrate. The angled direction of the applied pressure facilitates pushing aside the removed material. In a favorable variant of the present invention, the removal of the material from the surface is controlled by a mechanical profilometer. This measuring instrument provides a precise measurement of the removed material.

Another favorable embodiment of the invention utilizes a selective chemical attack to remove the residue. In an implementation, only the edge of the substrate is treated while the other parts of the substrate surface are not attacked. A chemical attack offers an efficient abrasion of material.

In a further example of the invention, a region on the surface surrounded by the edge region is covered by a protective layer. This layer protects the region between the edges from influences caused by the removal of material close to the edge. In an implementation, the protective layer is an etch resistant material. The etch resistant material particularly protects the surface between the edge from being etched by a physical and/or a chemical etchant. In a further favorable variant of the invention, the protective layer is formed by a photolithography, which offers the possibility to deposit and/or harden the protective layer especially in the region of the surface between the edges with a high precision.

The collar may also be removed by bombarding the collar with ions and/or ion clusters. In an implementation, the collar is bombarded at the interface. The interface is well suited for such bombardment because it is a predetermined breaking point, offering a good homogenous surface after the residue has been severed.

In another implementation, a local ion attack is used by directing ions, preferably ion clusters, at the edge of the substrate. An ion attack can be precisely localized at the edge of the substrate to effectively remove material. In a further advantageous embodiment of the invention, the ion attack is made by an ion beam being directed approximately perpendicular to the surface of the substrate. The approximately perpendicular direction of the ion beam allows a selective and effective removal of material. In a further advantageous example of the invention, the ion attack is made by an Argon ion beam directed on the region close to the edge of the substrate. The Argon ions can be easily accelerated and directed onto this region and therefore facilitate the removal of the material.

In a further advantageous embodiment of the invention, the substrate rotates during thinning or removal of the residue. Rotation permits the application of a removing agent to be stationary, and the entire edge around the substrate is treated by rotating the substrate.

According to a further advantageous variant of the invention, the entire surface including the edge region is planarized after the collar is removed to provide a very smooth surface, especially at the transitional region between the collar had been situated. This method can further improve the total thickness variance of the recycled substrate.

In another favorable embodiment of the invention, the surface including the edge is thinned in the planarizing step by about 0.1 to 0.3 µm, usually 0.2 µm, to remove any damages caused by an implantation step. In yet another example of the invention, the substrate is planarized without a heat treatment. Thus, not only the thermal load on the substrate is very low, but long processing times and a high energy consumption for a thermal treatment are avoided.

FIGS. 2 to 8 show a silicon wafer 1' comparable to the wafer 1' shown in FIG. 1 which results from processing according to the SMART-CUT® technology as shown with reference to FIGS. 1a–1e. However, it is not necessary that the wafers or substrates are pre-processed using the SMART-CUT® technology. Different techniques could be used to pre-process the wafers or substrates. In general, all substrates having at least a non-uniformity on the surface can be recycled using the present method. Typical materials are silicon in all modifications such as CZ-silicon, NPC-silicon, Epi-Silicon, FZ-silicon, germanium, sapphire, silicon carbide (SiC), $A_{III}B_V$-compounds such as Gallium arsenide (GaAs), Gallium nitride (GaN), Indium phosphide (InP) and their alloys or Silicon Germanium (SiGe) and their oxides. The materials can be doped or undoped, insulators, semi-insulator materials or Epi-materials. Further, the treated substrates are not restricted to wafers. The substrate can have any form or size that could be used in the field of semiconductor technology.

Figure 1C:
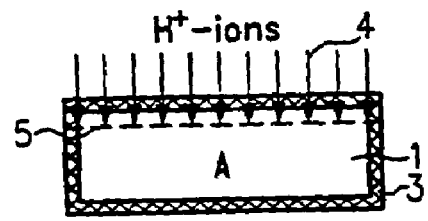
Figure 1D:
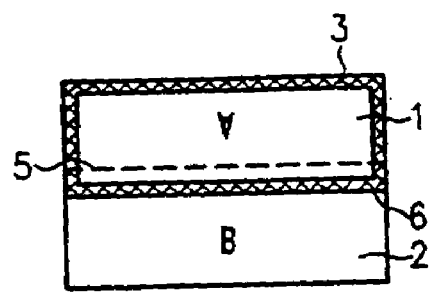
Figure 1E:
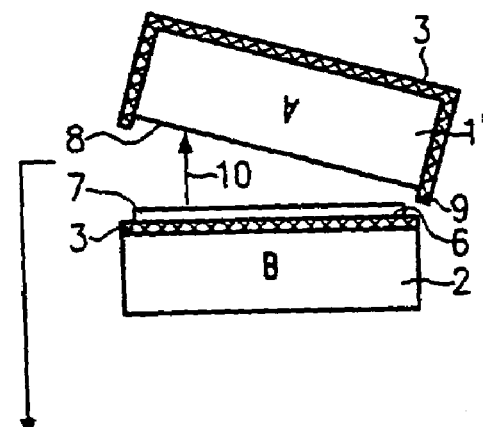
Figure 1F:
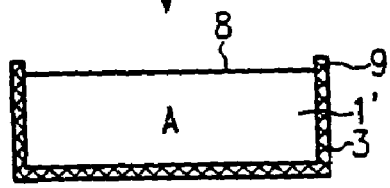

It is very well known that silicon wafers 1' as shown in FIGS. 2 to 8 have the shape of a thin, circular plate. FIGS. 2 to 8 show a vertical cross section through a substrate having such rotationally symmetrical shape. The wafer 1' has a residue or collar 9 close to an edge 27 of the wafer, which is treated with hydrogen ions in the implantation step of the SMART-CUT® technology as shown in FIG. 1c. If viewed from above, the collar 9 extends in a circle along the edge 27 similar to the circular plate shape of the wafer. In the case of a silicon wafer, the residue 9 consists of silicon and/or silicon dioxide. On the upper side of the wafer 1', a plain surface 8 is provided, surrounded by the residue 9. The surface 8 and the residue 9 form a profile of the substrate which has been created by the aforementioned method of the SMART-CUT® technology. The outermost portion of the surface 8 forms an interface 20 between the surface 8 and the collar or residue 9. This interface 20 has a weakened material stability due to the implantation process.

The collar 9 has a width of between about 1 and 5 mm and a thickness of between approximately 10 nanometers and 2 micrometers measured from the interface 20. The collar 9 surrounds an interior portion 24 while the area outside the collar 9 is an outer region 25. An imaginary level 26 of the interface 20 is shown extending beyond the wafer 1'. Apart from the profile, the substrate is limited by the edges 27 and a backside 28 which is the lower side of the substrate as shown in FIGS. 2 to 8. The collar 9 as well as the surface 8 can be covered by a thin oxide film which can be removed before further processing to make the wafer surface 8 planar.

Figure 2:
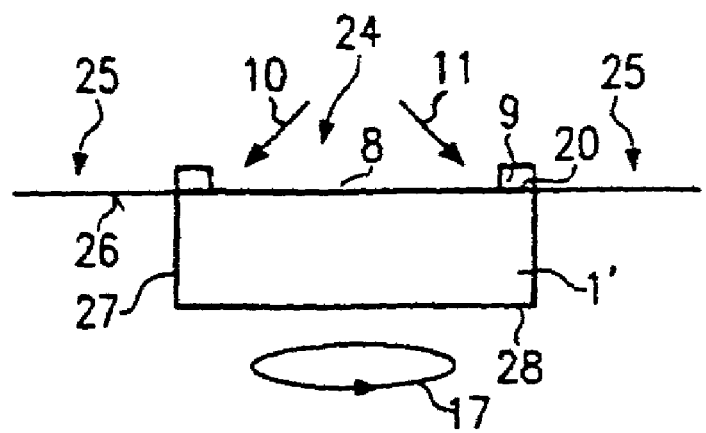
FIG. 2 shows a water jet or an air jet applied to the residue or collar according to a first embodiment of the present invention.

FIG. 2 shows a first embodiment of the present invention in which a jet of water 10 and/or a jet of air 11 is directed against the collar 9. The jet is directed at an acute angle against the residue 9, from the interior portion 25 of the surface 8 outward. The jets 10 and 11 may be applied by itself, or one after the other, or simultaneously with each other. The jets may be respectively directed from an upper side at an acute angle and outwardly to the collar 9, wherein they may impinge at least on the interface 20 between the surface 8 and the collar 9. The use of a jet stream of fluid is advantageous because it will not damage the surface 8. Instead of water or air, any suitable fluid can be used. For example, ultra pure water or inert gas like nitrogen or argon ions may be used. In an implementation, the source of the fluid is positioned close to the collar 9, and the size of the jet stream has a diameter of approximately 1 mm or less. Mechanical pressure can be added to help sever the collar at the weakened area of the interface 20.

The elliptical arrow 17 depicts the rotation of the wafer 1' about a central axis that is perpendicular to the plate-like surface of the wafer. Rotating the wafer enables the position of the jet source to remain constant, preferably in a position above the interior portion 24, so that the jet stream is permanently directed to a specific point of the interface 20. As the wafer rotates, the collar 9 is severed in a piecewise manner along the circumference of the wafer 1'. During this collar removal operation, the weakened or pre-weakened area at the bottom of the collar 9 is under mechanical pressure.

After the collar has been removed, a short final touch polishing of the surface 8 may be performed with a conventional CMP process over the entire surface 8 including its edges. In this step, about 0.2 µm of material is removed at the maximum, which is the amount approximately corresponding to the upper limit of the damaged area due to the implantation step used in the SMART-CUT® technology for fabricating of the split wafer 1'. This final polishing eliminates defects resulting from the implantation step shown in FIGS. 1a to 1f and provides a good TTV of the polished surface 8.

Figure 3:
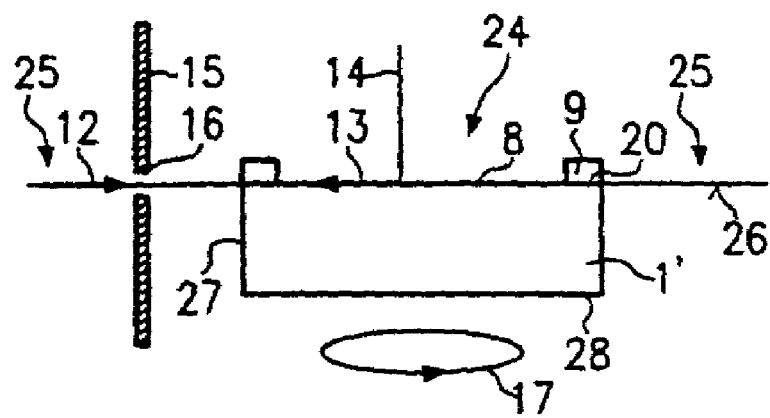
FIG. 3 shows a laser beam applied to the residue or collar according to a second embodiment of the present invention.

FIG. 3 shows a second embodiment of the present invention in which a laser beam (12, 13) is used to sever the collar 9. FIG. 3 depicts a wafer with the collar 9, as described above for FIG. 2. Arrows 12 and 13 depict laser beams wherein the laser beam 12 is applied from outside the wafer 1' and the laser beam 13 is applied from the interior portion 24 of the wafer 1'. The laser beams are aligned to be parallel to the surface 8 and impinge on the interface 20. The laser source can be an Excimer laser which releases excision energy through UF photons. A YAG (yttrium-aluminum garnet-laser with neodymium or carbon dioxide) could also be used wherein the frequencies can be intensified. The kind of laser used depends on the type of the material to be removed.

A targeting system may be used to orient the laser beams 12, 13 to focus on the local weakened area of the interface

20. A screen 15 with a slit 16 may be provided on the side of the edge 27 of the wafer 1'. A laser beam 12 is focused by the slit 16 directly onto the interface 20. The laser beams 12, 13 can be focused onto the residue or collar 9 by means of fiber optics. An alternative implementation utilizes a mirror 14. The mirror may be in the center of, and perpendicular to, the surface 8. The mirror reflects the laser beam 13 from its interior position parallel to the surface 8 onto the interface 20. The elliptical arrow 17 again indicates the direction of rotation of the wafer 1' that may be used during the severing operation.

If the wafer 1' has been produced by the SMART-CUT® technology, the interface 20 is a local weakened or pre-weakened area. Either or both laser beams 12, 13 may be directly focused on the interface 20. The laser beam cuts the collar 9 from the surface in a piecewise manner, and mechanical pressure can be additionally applied by an appropriate means to help detach the pre-cut collar 9 from the surface 8. The surface is then treated by final polishing similar to that of the first embodiment.

Figure 4:
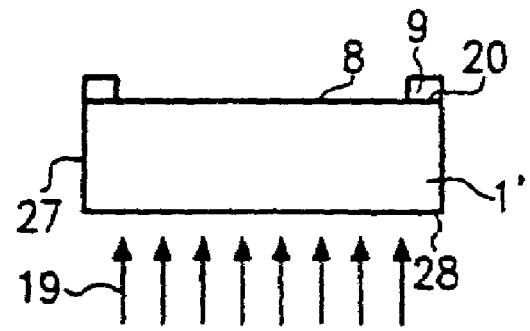
FIG. 4 shows a shock wave applied to a backside of a substrate according to a third embodiment of the present invention.

FIG. 4 shows a third embodiment of the present invention in which a shock wave 19 is applied to the backside 28 of the silicon wafer 1'. The silicon wafer 1' with the collar 9 has the same structure as explained above with respect to FIGS. 2 and 3. The same reference numerals refer to the same parts as indicated in the corresponding previous descriptions. The shock wave 19 can be applied by an energy impulse generating the shock wave with an amplitude suitable for detaching the collar 9 from the wafer 1' at the interface 20. The shock wave 19 can be a single impulse or several repeated impulses. This method is especially advantageous if the interface 20 has been pre-weakened, such as by the implantation of atomic species as used in the SMART-CUT® technology.

The shock wave 19 is applied only to separate the collar 9 from the wafer 1' into pieces, preferably at the interface 20. Even if the surface 8 has been produced by detachment from another wafer, such as that described in WO 01/80308 A2, the present method can be applied to remove the collar 9. Lastly, the entire surface 8 is polished with a CMP process similar to that described above with reference to the first embodiment.

Figure 5:
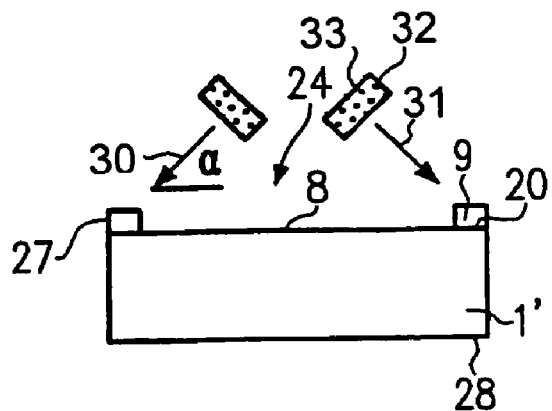
FIG. 5 shows local polishing at an edge of a wafer according to a fourth embodiment of the present invention.

FIG. 5 shows a fourth embodiment that uses local polishing at an edge of the wafer to remove the residue or collar. As shown by the arrows 30 and 31 in FIG. 5, a chemical and/or mechanical component (32, 33) is directed at an angle relative to the surface 8 to polish only the collar 9. The chemical/mechanical polishing is performed in this implementation with one or more polishing pads 32, such as polyurethane pads with colloidal silica, that are directed at an angle alpha relative to the surface 8, and with a mechanical pressure applied on the collar 9. The polishing pad may be impregnated with a polishing slurry 33 which contains chemical components such as KOH and reacts with the material of the residue or collar 9 and the edge successively with help of mechanical pressure. All directions of attack that are directed to the collar 9 or to the interface 20, in addition to the angles shown by arrows 30 and 31, can be chosen for chemical/mechanical polishing. Although not shown, it is contemplated that the wafer can be rotated during chemical/mechanical polishing.

The difference between the wafer thickness at the edge 27 of the wafer 1' and at a point of the interior of the wafer 1'0 is evaluated, and the polishing process ends when this difference is near or equal to a predetermined value close to zero. Hence, the material removal of the collar may be controlled by a mechanical profilometer (not shown). Specifically, the removal process is finished when the values determined by the mechanical profilometer show that the collar 9 has been removed from the surface 8 resulting in the same surface level in the region close to the edge 27 as that of the rest of the surface 8. Finally, the entire surface 8 is polished with a conventional short CMP process similar to that described above with reference to the first embodiment.

Figure 6:
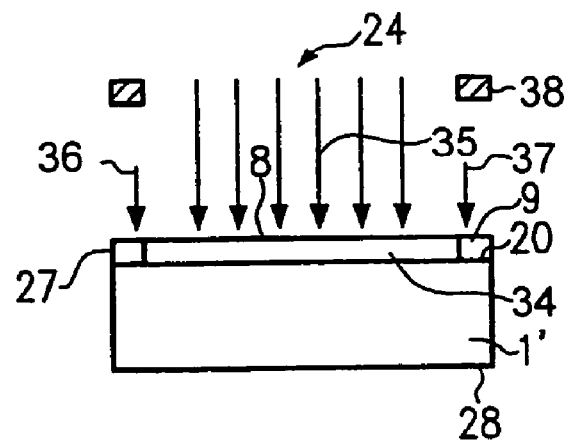
FIG. 6 shows a selective chemical attack at an edge of a wafer according to a fifth embodiment of the present invention.

FIG. 6 shows a fifth embodiment in which the residue or collar 9 at the edge of the surface 8 of the wafer is removed by a selective chemical attack of the surface region close to the edge 27 of the wafer 1'. The region on the surface 8 between the collar 9 is protected in a photolithography step, wherein a photoresist layer 34 is deposited on the surface 8 including the region close to the edge 27. A mask layer 38 is provided to cover the residue or collar in the region close to the edge 27 of the wafer 1', and a light or an electronic beam 35 is shined through the mask 38 to the surface 8 so that only the surface region between the collar 9 is exposed to the light or ion beam 35. The mask 38 is then removed and the photoresist 34 is developed in a further step. The non-exposed regions of the photoresist 34 are removed by etching so that only the surface 8 between the edges of the collar 9 is protected by the hardened photoresist layer 34.

Referring again to FIG. 6, the collar 9 is then etched by exposing the wafer 1' to a chemical substance such as KOH, TMAH, NH$_4$OH or NaOH, which acts at least on the points of attack shown by the arrows 36 and 37 on the collar 9. The chemical substance reacts with the material of the collar and removes it. During chemical attack, the wafer 1' can be rotated.

The removal of the residue or collar 9 is controlled by the duration and temperature of the etch process and can be further controlled after etching with the mechanical profilometer described above with reference to FIG. 5. For example, the thickness of the wafer 1' at the region near the edge 27 is compared after a certain etch time with the thickness of the wafer 1' in an interior 24 of the wafer 1', and if the difference is below a predetermined value, the etch process can be stopped and the wafer surface cleaned from the photoresist layer 34. Since the surface may further be treated with a final polishing similar to that of the first embodiment, the protecting layer 34 can be removed from the surface 8 in a separate step but could also be removed together with a final polishing step on this surface.

Figure 7:
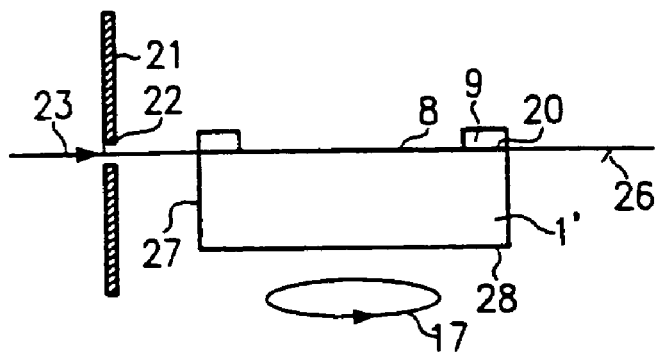
FIG. 7 shows a collar or residue being bombarded with ions and/or ion clusters according to a sixth embodiment of the present invention.

FIG. 7 depicts a sixth embodiment in which the collar 9 is bombarded with ions and/or ion clusters 23. The beam of ion and/or ion clusters 23 is directed to the interface 20 between the collar 9 and the surface 8. The ion beam 23 is oriented parallel to the surface 8 of the wafer 1' and may be focused by a screen 21 having a slit 22 provided near the edge 27 of the wafer 1'. The beam 23 of ions and/or ion clusters cuts the collar 9 in a piecewise manner to sever it from the wafer 1'. The wafer 1' can be rotated as indicated by the direction of rotation 17, which may be taken about a vertical axis in the center of the surface 8 of the wafer 1'. Thus, the wafer may rotate as a stationary ion beam 23 that is focused on the interface 20 cuts the collar 9.

Figure 8:
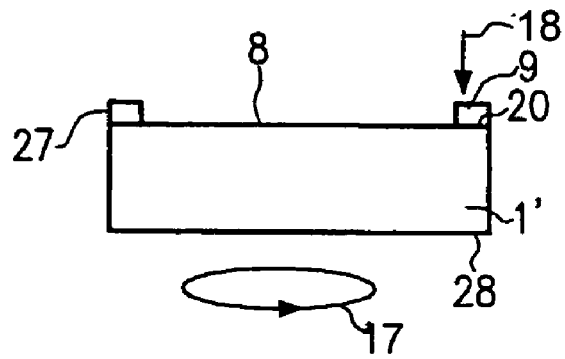
FIG. 8 shows a local ion attack at an edge of a wafer according to a seventh embodiment of the present invention.

FIG. 8 shows a seventh embodiment of the present method in which the region of the surface 8 close to the edge 27 of the wafer 1' is planarized by a successive thinning using a local ion attack at the edge 27 of the wafer 1'. In this method, an ion beam, consisting of Argon ions in this embodiment, is directed approximately perpendicular to the surface 8 onto the residue or collar 9 as shown by the arrow 18 in FIG. 8. Instead of Argon ions, clusters of Argon ions can be used for local ion etching. A gas cluster ion beam (GCIB) technique such as that developed by the EPION Corporation, Billerica Mass., can be used to direct the ion beam 17 onto the collar 9, or a conventional ion beam implanter could be used.

During the ion attack, the wafer 1' is rotated as shown by the arrow 17 so that the ion beam 18 can act on the entire edge of the wafer 1'. In this manner, the ions bombard the collar 9 from above and continuously thin the collar down to the level of the surface 8. As described with reference to FIGS. 5 and 6, the abrasion of the collar 9 can be controlled by a mechanical profilometer that measures the thickness difference between a region of the wafer near the edge 27 and an interior region 24 of the wafer 1'.

What is claimed is:

1. A method for recycling a substrate that has a detachment profile that includes a residual topography on its surface resulting from an ion implantation process, which method comprises:
    applying an impact force to sever the residual topography of the detachment profile; and
    polishing the entire surface of the substrate to eliminate defects and to prepare the surface in condition for molecular bonding to another substrate.

2. The method according to claim 1 wherein the impact force is a mechanical pressure applied at an angle relative to the surface of the substrate.

3. The method according to claim 1 wherein the impact force is a local ion attack to sever the residual topography.

4. The method according to claim 3 which further comprising directing an ion beam approximately perpendicular to the surface of the substrate to sever the residual topography.

5. The method according to claim 3 wherein the local ion attack is provided by an Argon ion beam.

6. The method according to claim 3 which further comprises rotating the substrate to assist in severing the residual topography.

7. The method according to claim 3 which further comprises controlling removal of the residual topography with a mechanical profilometer.

8. The method according to claim 3 wherein the substrate is sapphire, silicon carbide or gallium nitride.

9. The method according to claim 1 wherein the impact force is a laser beam applied to sever the residual topography.

10. The method according to claim 9 wherein the laser beam is focused on at least the interface.

11. The method according to claim 9 wherein the laser beam is aligned parallel to the surface of the substrate.

12. The method according to claim 11 which further comprises focusing the laser beam onto the residual topography with a screen having a slit.

13. The method according to claim 1 wherein the residual topography is severed by directing an impact force provided by at least one of a jet stream of water, a jet stream of air, and a jet stream of fluid at it.

14. The method according to claim 13 wherein the jet stream is directed against the residual topography at an acute angle to the surface.

15. The method according to claim 13 wherein the jet stream impinges at least on the interface.

16. The method according to claim 1 wherein the impact force is a shock wave applied on a back side of the substrate to sever the residual topography.

17. The method according to claim 1 wherein the impact force is applied by bombarding the residue with at least one of ions and ion clusters to sever the residual topography.

18. The method according to claim 17 which further comprises bombarding the residual topography at the interface with the ions or ion clusters.

19. The method according to claim 1 wherein the residual topography is severed in a piecewise manner.

20. The method according to claim 1 further comprising planarizing the entire surface of the substrate after severing of the residual topography so that the surface is in a condition for bonding to another semiconductor substrate.

21. The method according to claim 20 which further comprises thinning the surface by about 0.1 to 0.3 µm during planarizing.

22. The method according to claim 1 wherein the substrate is planarized without a heat treatment.

23. The method according to claim 1 wherein the substrate is sapphire, silicon carbide or gallium nitride.

24. A method for recycling a substrate that has a detachment profile that includes a residual topography resulting from an ion implantation process, which method comprises:
    removing the residual topography of the detachment profile by rotating the substrate while exposing at least the residual topography to a chemical substance that reacts with the residue; and
    polishing the entire surface of the substrate to eliminate defects and to prepare the surface in condition for molecular bonding to another substrate;
    wherein a region on the surface of the substrate is covered with a protective layer prior to removing the residual topography to avoid chemical attack of that region.

25. The method according to claim 24 which further comprises controlling the removal of the residual topography with a mechanical profilometer.

26. The method according to claim 24 wherein the protective layer is formed by photolithography.

27. The method according to claim 24 wherein the protective layer is an etch resistant material and is applied prior to the chemical removal of the residual topography.

28. The method according to claim 24 wherein the residual topography is removed in a piecewise manner.

29. The method according to claim 24 wherein the substrate is sapphire, silicon carbide or gallium nitride.

* * * * *